United States Patent [19]

Niclas

[11] Patent Number: 4,752,746
[45] Date of Patent: Jun. 21, 1988

[54] WIDEBAND MICROWAVE MATRIX AMPLIFIER

[75] Inventor: Karl B. Niclas, Portola Valley, Calif.

[73] Assignee: Watkins-Johnson Company, Palo Alto, Calif.

[21] Appl. No.: 15,908

[22] Filed: Feb. 18, 1987

[51] Int. Cl.$^4$ ............................................. H03F 3/60
[52] U.S. Cl. ..................................... 330/277; 330/54; 330/286
[58] Field of Search ......................... 330/54, 277, 286

[56] References Cited

U.S. PATENT DOCUMENTS 4,291,286 9/1981 Wagner ........................... 330/227 X

OTHER PUBLICATIONS

Ten et al, "A Wide-Band Transistor Amplifier of Nanosecond Pulses", *Instruments and Experimental Techniques*, vol. 17, No. 6, Pt. 2, May 1975, pp. 1650–1693.

*Primary Examiner*—James B. Mullins
*Attorney, Agent, or Firm*—Flehr, Hohbach, Test, Albritton & Herbert

[57] ABSTRACT

A microwave amplifier that both multiplicatively and additively amplifies microwave frequency signals. The amplifier, herein coined a matrix amplifier, is a distributed amplifier with two or more tiers (rows) of transistors. Each tier has a plurality of transistors which additively amplify the signal entering that row of the amplifier, and each row multiplicatively amplifies the output of the previous row. The gates of the transistors in each row are sequentially coupled to an input transmission line having a series of transmission elements. The outputs of all the transistors from each row are sequentially coupled to the input transmission line of the next tier, except that the outputs of the last tier are coupled to an output transmission line for transmitting the output of the amplifier to an output node. Furthermore, each transmission lines has (1) at least one line termination at one of its ends for absorbing signals incident on that end of the transmission line, and (2) biasing means for d.c. biasing the transmission line at a corresponding voltage potential.

8 Claims, 15 Drawing Sheets

DESCRIPTION OF CIRCUIT COMPONENTS $Q_{mn}$ — TRANSISTOR n ON TIER m
$T_{In}$ — INPUT MATCHING TRANSMISSION LINE ELEMENTS
$T_{On}$ — OUTPUT MATCHING TRANSMISSION LINE ELEMENTS
$T_{1n}$ — GATE LINE TRANSMISSION LINE ELEMENTS
$T_{2n}$ — CENTER LINE TRANSMISSION LINE ELEMENTS
$T_{3n}$ — DRAIN LINE TRANSMISSION LINE ELEMENTS
$T_{D1n}$ — TRANSFORMING TRANSMISSION LINE ELEMENTS (1. TIER)
$T_{D2n}$ — TRANSFORMING TRANSMISSION LINE ELEMENTS (2. TIER)
$T_{4n}$ — DRAIN LINE OPEN-CIRCUIT SHUNT STUBS
$R_G$ — GATE LINE TERMINATION
$R_{Cn}$ — CENTER LINE TERMINATIONS
$R_D$ — DRAIN LINE TERMINATION
$T_{Cn}$ — CENTER LINE SHORT-CIRCUIT SHUNT STUBS
$T_D$ — DRAIN LINE SHORT-CIRCUIT SHUNT STUB $$\Delta V_{BK} = C_K * \Delta V_{BK-1}$$
$$C_K \in [1.05, 1.40]$$

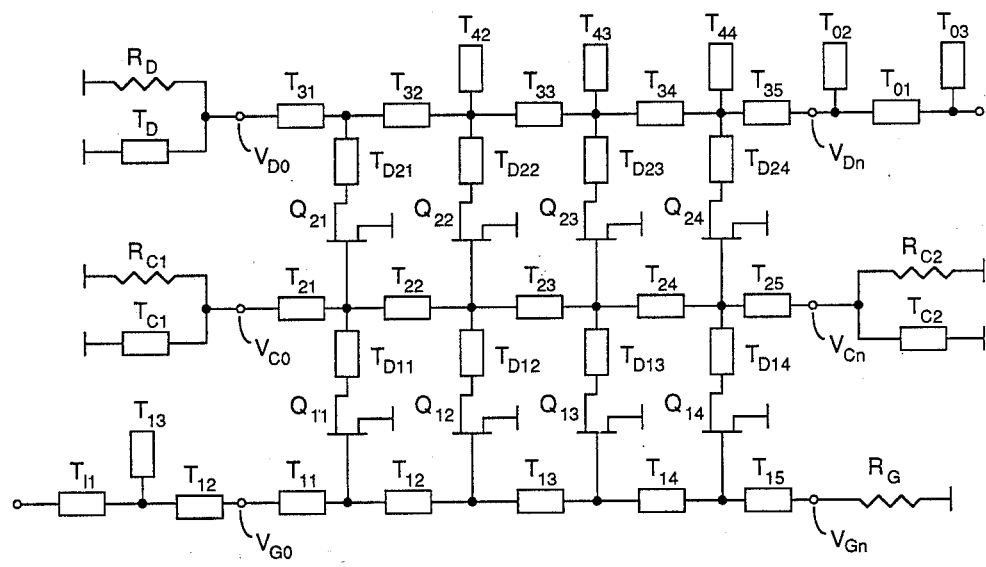

FIGURE 2

DESCRIPTION OF CIRCUIT COMPONENTS $Q_{mn}$ — TRANSISTOR n ON TIER m $T_{In}$ — INPUT MATCHING TRANSMISSION LINE ELEMENTS $T_{On}$ — OUTPUT MATCHING TRANSMISSION LINE ELEMENTS $T_{1n}$ — GATE LINE TRANSMISSION LINE ELEMENTS $T_{2n}$ — CENTER LINE TRANSMISSION LINE ELEMENTS $T_{3n}$ — DRAIN LINE TRANSMISSION LINE ELEMENTS $T_{D1n}$ — TRANSFORMING TRANSMISSION LINE ELEMENTS (1. TIER)

$T_{D2n}$ — TRANSFORMING TRANSMISSION LINE ELEMENTS (2. TIER)

$T_{4n}$ — DRAIN LINE OPEN-CIRCUIT SHUNT STUBS $R_G$ — GATE LINE TERMINATION $R_{Cn}$ — CENTER LINE TERMINATIONS $R_D$ — DRAIN LINE TERMINATION $T_{Cn}$ — CENTER LINE SHORT-CIRCUIT SHUNT STUBS $T_D$ — DRAIN LINE SHORT-CIRCUIT SHUNT STUB

| INTRINSIC ELEMENTS | EXTRINSIC ELEMENTS |
|---|---|
| $g_m$ = 29.7 mS | $R_g$ = 5.1 Ohm |
| $\tau_0$ = 1.2 psec | $L_g$ = .152 nH |
| $C_{gs}$ = .1385 pF | $R_s$ = .5 Ohm |
| $C_{gd}$ = .015 pF | $L_s$ = .034 nH |
| $C_{dc}$ = .033 pF | $C_{ds}$ = .023 pF |
| $R_{gs}$ = 4.0 Ohm | $R_d$ = 1 Ohm |
| $R_{ds}$ = 213 Ohm | $L_d$ = .434 nH |

WIDEBAND MICROWAVE MATRIX AMPLIFIER

The present invention relates generally to microwave amplifiers, and particularly to an amplifier that makes simultaneous use of additive and multiplicative amplification processes.

BACKGROUND OF THE INVENTION

Amplification from two or more active devices may be classified as multiplicative or additive amplification. In multiplicative amplification, the overall gain is proportional to the product of the gains supplied by the individual modules, while in additive amplification the gain is proportional to the sum of the powers contributed by the individual active devices.

The vast majority of amplifiers makes use of the multiplicative process through cascading. The most prominent exception is the distributed or traveling wave amplifier whose amplifying mechanism is based on the additive principle. See, W. S. Percival, "Thermionic Valve Circuits", British Pat. No. 460 562, Jan. 25, 1937; and E. L. Ginzton, W. R. Hewlett, J. H. Jasberg, and J. D. Noe, "Distributed Amplification", Proc. IRE, Vol. 36, pp. 956–969, August 1948.

While in most practical applications additive amplification produces less gain per device when compared to multiplicative amplifiers, it yields significantly larger bandwidths through the ingenious use of the active devices' parasitics. Since 1937, when the invention of the distributed amplifier was patented, very few modifications of the original concept have surfaced. However, recently two variations have emerged that are of practical importance. In the first, the common source MESFET (MEtal Semiconductor Field Effect Transistor) is replaced by a cascaded two-port that consists of a common source first stage followed by a common gate second stage separated by a two-port that serves as an interstage transformer. See D. E. Dawson, M. L. Salib, L. E. Dickens, "Distributed Cascode Amplifier and Noise Figure Modeling of an Arbitrary Amplifier Configuration", ISSCC Digest, 1984. This type of amplifier produces moderately higher gains and significantly higher reverse isolations.

In the second modification, two distributed amplifier circuits are paralleled by establishing a common drain line. The input signal is divided and applied to the two input terminals of the ensuing network while the output signal is extracted at the common drain terminal. See Y. Ayasli, L. D. Reynolds, R. L. Mozzi, and L. K. Hanes, "2-20 GHz GaAs Traveling-Wave Power Amplifier", IEEE Trans. Microwave Theory Tech., Vol. MTT-32, March 1984. In this case the output power is doubled with no change in gain.

The present invention is a circuit that adds a new dimension to the distributed amplifier in the form of two or more rows of transistors, i.e., active tiers. In its most general form the new amplifier consists of an array of m rows and n columns of active devices. Each column is linked to the next by inductors or transmission line elements connected at the input and output terminals of each transistor, thereby composing a lattice of circuit elements. For m active tiers, there are 2m idle ports that are terminated into power dissipating loads. The purpose of adding the vertical dimension to the horizontal dimension of the distributed amplifier in the form of the $m \times n$ rectangular array is to combine the multiplicative and additive amplification process in one and the same module. The advantages of this new device include significantly higher gain and reverse isolation over wide bandwidths at considerably reduced size. Due to its regular geometrical arrangement of circuit elements very much similar to the rectangular array of mathematical elements in a matrix, the new device is herein called a matrix amplifier.

It is therefore a primary object of the present invention to provide a microwave amplifier that provides both multiplicative and additive amplification in a distributed amplifier with two or more rows of transistors, i.e., active tiers.

SUMMARY OF THE INVENTION

In summary, the present invention is a microwave amplifier that provides both multiplicative and additive amplification in a distributed amplifier with two or more rows of transistors. Each row has a plurality of transistors which additively amplify the signal entering that row of the amplifier, and each row multiplicatively amplifies the output of the previous row.

The gates of the transistors in each row are sequentially coupled to a gate transmission line having a series of transmission elements. The outputs of all the transistors from each row are sequentially coupled to another transmission line, which is the output transmission line for the last row of the amplifier, and for the other rows of the amplifier is the gate transmission line for the following row.

BRIEF DESCRIPTION OF THE DRAWINGS

Additional objects and features of the invention will be more readily apparent from the following detailed description and appended claims when taken in conjunction with the drawings, in which:

FIGS. 2 and 2A depict a schematic of a $2 \times 4$ matrix amplifier, and the layout of this circuit.

DESCRIPTION OF THE PREFERRED EMBODIMENTS

Figure 1:
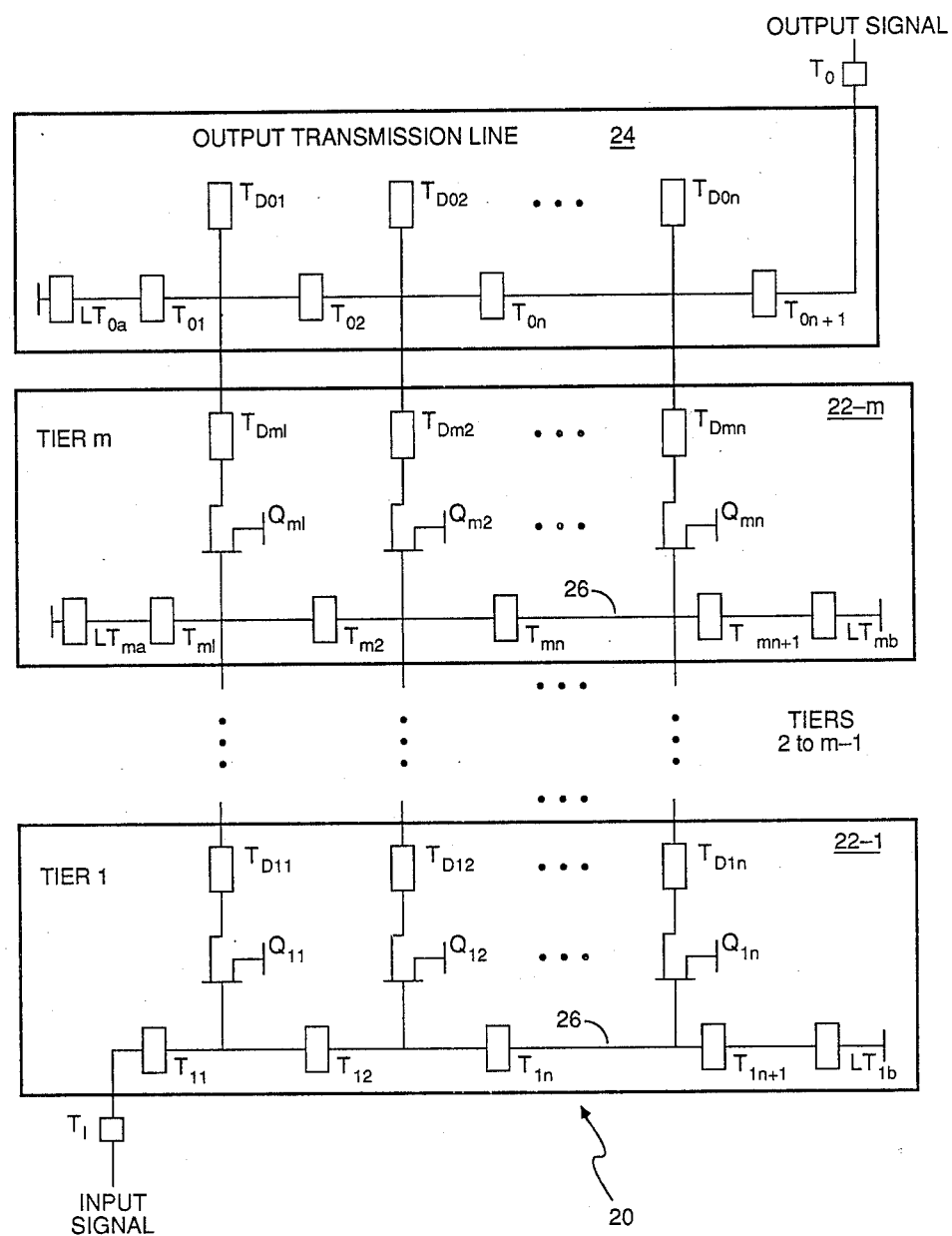
FIG. 1 is a block diagram of a matrix amplifier.

FIG. 1 depicts a matrix amplifier 20 with m multiplicative tiers 22-1 to 22-m (sometimes called rows 22) each having n transistors $Q_{ij}$ where "i" identifies the tier, and "j" identifies the link (sometimes called a column) in which the transistor is located. In one preferred embodiment, the transistors are Gallium Arsenide (GaAs) field effect (MESFET) transistors, each having a 0.25×200 micron gate and a peak doping of $5.7 \times 10^{17}$ cm$^{-3}$.

The gates of the transistors in each tier 22 are coupled to one another by a transmission line 26, and the outputs of each transistor is coupled to another transmission line by a transmission line element $T_{Dij}$.

All of the elements labelled $T_x$ are microwave transmission elements, where "x" identifies the placement and purpose of the element. The elements labelled $LT_x$ are line termination elements used to bias the transistors and to absorb signals which would otherwise be reflected back into the circuit.

The input signal is brought into the matrix amplifier 20 by an input impedance matching network $T_I$. The amplified output signal generated by the matrix amplifier is generated by passing the output of the last multiplicative tier 22-m through an output transmission line 24, and then an output impedance matching network $T_O$.

The transistors $Q_{xn}$ in each tier 22 additively amplify the microwave signal entering that row. Each tier multiplicatively amplifies the output of the previous tier. Thus the matrix amplifier provides both additive and multiplicative amplification.

Figure 1A:
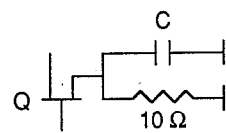
FIGS. 1A–1C show the DC biasing used in the preferred embodiment.
Figure 1B:
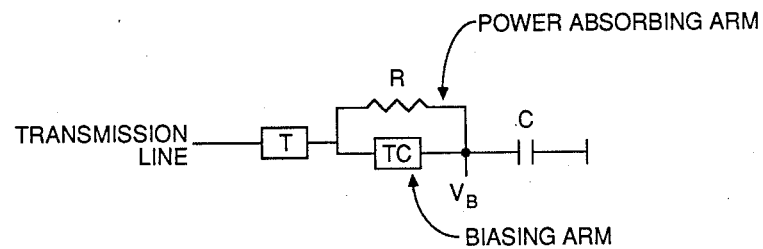
Figure 1C:
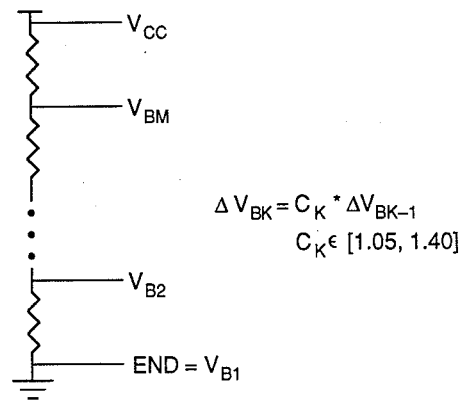

FIG. 1 shows only the a.c. circuit elements of the matrix amplifier. FIGS. 1A–1C show the d.c. circuit elements used to bias the matrix amplifier. In FIG. 1A, the ground connection to each transistor's source is shown to consist of two parallel arms: a capacitor tied to the circuit's reference voltage, hereinafter called ground; and a resistor (typically 10 ohms) which d.c. couples the source to ground. Thus the resistor is used to bias the transistor, and the capacitor a.c. couples the transistor's source to ground.

In FIG. 1B, it is shown that each transmission line is terminated with a resistor R coupled to the reference voltage, for absorbing power. For transmission lines that need to be biased at a voltage higher than the ground potential, the transmission line is also terminated with a biasing arm consisting of a transmission element TC which is tied, in series, to a biasing voltage potential $V_B$ and a d.c. blocking capacitor C.

FIG. 1C shows a simple voltage divider, which is external to the monolithic amplifier in the preferred embodiment, for providing the Vcc and other biasing voltages used in the matrix amplifier.

In one embodiment of the present invention, the gain of the matrix amplifier is increased by providing each tier 22-k of the amplifier has a bias voltage $\Delta V_{Bk}$ which is slightly greater than the bias voltage ($\Delta V_{Bk-1}$) of the previous tier (k-1). The inventor has found that increasing the bias voltage of successive tiers (i.e., successive transmission lines) by a factor ranging between 1.05 and 1.4 provides greater power than matrix amplifiers using the same bias voltage in every tier.

Figure 1D:
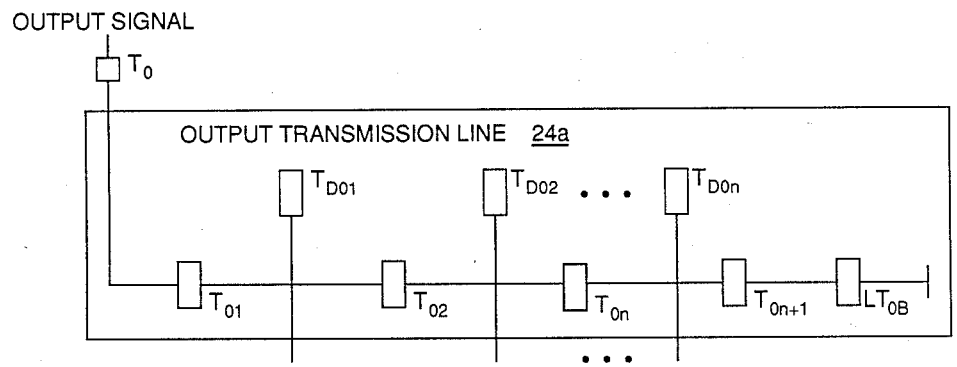
FIG. 1D depicts an alternate output transmission line.

As shown in FIG. 1D, in an alternate embodiment of the invention, the output signal is taken from the same side of the output transmission line as the input signal is transmitted into the input transmission line of the first tier 22-1 (see FIG. 1), instead of from the opposite side as shown in FIG. 1. As will be understood by those skilled in the art, this will require adjustment of the sizes of the transmission elements T used in the amplifier. In at least some applications, this alternate arrangement will provide similar gain, but better a signal to noise ratio.

The matrix amplifier 22 is unlike a series of cascaded distributed amplifiers in several ways. First, the output from each of the active elements in the lower tiers are directly coupled (by transforming line elements $T_{Dij}$) to the gates of the active elements in the following tier. This allows each column of the matrix amplifier to multiplicatively amplify the signal traveling through that column. Secondly, each tier can be separately biased, which is important for obtaining the best gain over the broadest possible frequency range. Other differences and advantages of the matrix amplifier are discussed below.

As will also be described in detail below, each transmission element and resistor must be sized to match impedances to keep each portion of the amplifier in phase with the others.

FIG. 2 schematically depicts an exemplary matrix amplifier designed by inventor and used as an example of the invention throughout this description. This preferred embodiment is a matrix amplifier with m=2 multiplicative tiers each having n=4 transistors. The elements labelled R are line termination resistors.

Figure 2A:
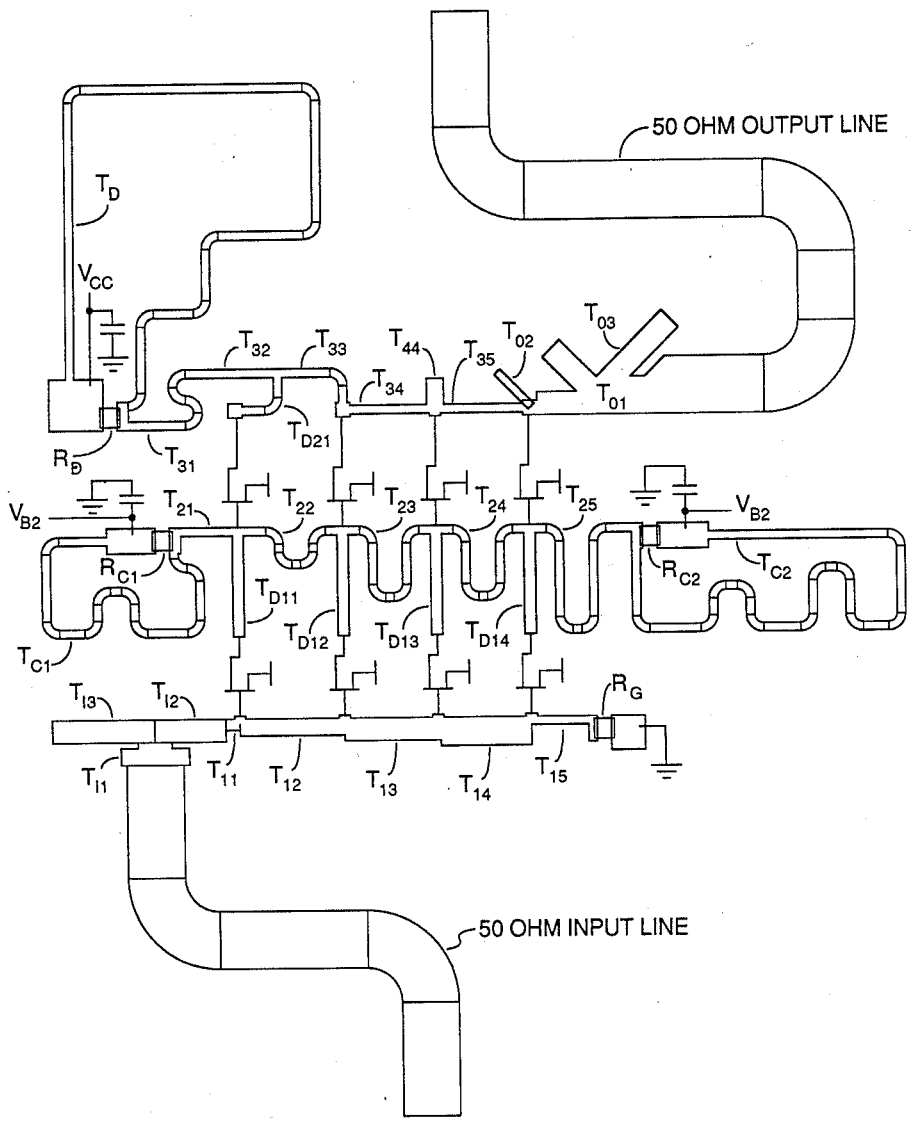

FIG. 2A depicts the layout of the metal layer of the exemplary matrix amplifier schematically represented in FIG. 2. Symbols for the transistors have been added to show their placement, and the transmission and line termination elements have been labelled with the same symbols as used in FIG. 2. Note that in this particular example, the drain line open-circuit shunt stubs $T_{42}$ and $T_{43}$ are omitted, because their computed length was equal or very close to zero. Typically, the first column of transistors (j=1) will have no shunt stub, and the following columns will have increasingly long shunt stubs $T_{4j}$.

Theory of Operation. The present invention, herein called a matrix amplifier, combines the processes of additive and multiplicative amplification in one and the same module. Its purpose therefore is to combine the characteristic features of both principles, namely, to increase the gain of the additive amplifier and the bandwidth of the multiplicative amplifier. This can be accomplished in a module whose size is significantly reduced when compared with the traditional amplifier types of similar gain and bandwidth performance.

Figure 3A:
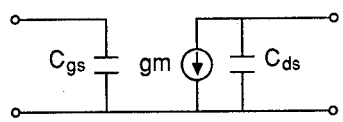
FIGS. 3a–d depict circuit models used to analyze a matrix amplifier.
Figure 3B:
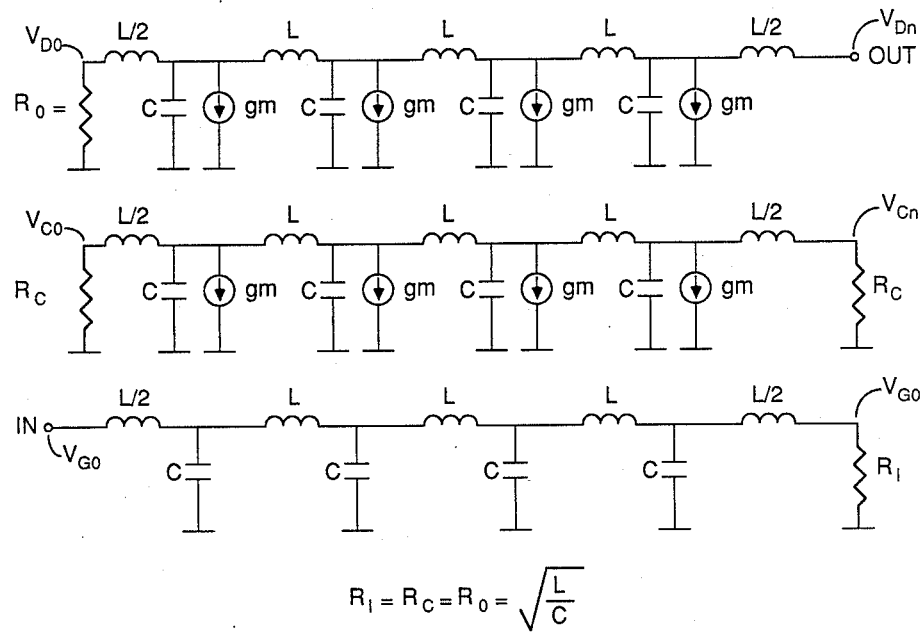

The principle of the matrix amplifier is most easily explained by means of a simplified schematic making use of an idealized transistor model. As shown in FIG. 3A, the latter consists of an input ($C_{gs}$), an output shunt capacitance ($C_{ds}$) and a current generator that is controlled by the input voltage. FIG. 3B is a schematic drawing of a 2×4 matrix amplifier using the simplified transistor model shown in FIG. 3A.

Each link of the input and output artificial transmission line consists of the input and the output shunt capacitances $C = C_{gs} + C_{ds}$ and the inductance $\frac{1}{2}$ L. Choosing $$C = C_{gs} + C_{ds}$$

makes all three artificial transmission lines of the amplifier in FIG. 3B identical and requires adding shunt capacitance other than that inherent to the devices to the gate line and the drain line, but none to the center line. The idle gate and drain port are terminated with a resistor that equals the characteristic impedances of their respective artificial transmission lines. In contrast, both idle ports of the center line are terminated into the arbitrary resistor $R_c$. Since the idealized circuit in FIG. 3B has no feedback path between the transmission lines and, in addition, employs identical artificial transmission lines on both sides of the center line, the input and output reflection coefficients are identical and independent of the characteristics of the center transmission line and its terminations. It should be pointed out, however, that this condition no longer exists as soon as the idealized transistors are replaced by real devices which have parallel and series feedback, as well as input and output admittances that cannot be made identical by attaching additional circuit elements.

The relationship between the input and output voltages and currents of an elementary module as displayed in FIG. 3B and consisting of n links may be expressed by the quadratic matrix.

$$\begin{bmatrix} V_{D0} \\ I_{D0} \\ V_{C0} \\ I_{C0} \\ V_{G0} \\ I_{G0} \end{bmatrix} = \begin{bmatrix} \left(1 - \frac{1}{2}\Omega^2\right) & j\Omega Z_o\left(1 - \frac{1}{4}\Omega^2\right) & j\frac{\Omega}{2} Z_o g_m & -\frac{\Omega^2}{4} Z_o^2 g_m & 0 & 0 \\ j\frac{\Omega}{Z_o} & \left(1 - \frac{\Omega^2}{2}\right) & g_m & j\frac{\Omega}{2} Z_o g_m & 0 & 0 \\ 0 & 0 & \left(1 - \frac{\Omega^2}{2}\right) & j\Omega Z_o\left(1 - \frac{\Omega^2}{4}\right) & j\frac{\Omega}{2} Z_o g_m & -\frac{\Omega^2}{4} Z_o^2 g_m \\ 0 & 0 & j\frac{\Omega}{Z_o} & \left(1 - \frac{\Omega^2}{2}\right) & g_m & j\frac{\Omega}{2} Z_o g_m \\ 0 & 0 & 0 & 0 & \left(1 - \frac{\Omega^2}{2}\right) & j\Omega Z_o\left(1 - \frac{\Omega^2}{4}\right) \\ 0 & 0 & 0 & 0 & j\frac{\Omega}{Z_o} & \left(1 - \frac{\Omega^2}{2}\right) \end{bmatrix}^n \begin{bmatrix} V_{Dn} \\ -I_{Dn} \\ V_{Cn} \\ -I_{Cn} \\ V_{Gn} \\ -I_{Gn} \end{bmatrix}$$

Where $\Omega = \omega \sqrt{LC} = 2\pi f \sqrt{LC}$ (Eq. 1a)

and $Z_o = \frac{L}{C}$ (Eq. 1b)

are the normalized frequency and the characteristic impedance of the artificial input and output transmission lines, respectively. The voltages and currents are measured at the input of the drain line ($V_{D0}$, $I_{D0}$), the center line ($V_{C0}$, $I_{C0}$), the gate line ($V_{G0}$, $I_{G0}$) and the ports of the respective output lines ($V_{Dn}$, $I_{Dn}$, $V_{Cn}$, $I_{Cn}$, $V_{Gn}$, $I_{Gn}$). If we now terminate the idle ports in accordance with the schematic of FIG. 3B, i.e., $$V_{Gn} = -Z_o I_{Gn} \quad \text{(Eq. 1c)}$$

$$V_{D0} = -Z_o I_{D0} \quad \text{(Eq. 1d)}$$

$$V_{C0} = -R_c I_{C0} \quad \text{(Eq. 1e)}$$

$$V_{Cn} = -R_c I_{Cn} \quad \text{(Eq. 1f)}$$

and further assume that our matrix amplifier has n=4 links we find four frequencies for which the input and output reflection coefficients are zero, namely $$\Omega = 0$$

$$\Omega = \sqrt{2 - \sqrt{2}}$$

$$\Omega = \sqrt{2} \text{ and}$$

$$\Omega = \sqrt{2 + \sqrt{2}}.$$

The S parameters for the first and the third normalized frequency can be easily determined with matrix equation 1, shown above. They are $\Omega = 0$:

$$S_{11} = S_{22} = 0 \quad \text{(Eq. 2a)}$$

$$S_{12} = 0 \quad \text{(Eq. 2b)}$$

$$S_{21} = \frac{n^2 R_c}{4 Z_o} (g_m Z_o)^2 \quad \text{(Eq. 2c)}$$

$\Omega = \sqrt{2}$ and $n = 4$:

$$S_{11} = S_{22} = 0 \quad \text{(Eq. 2d)}$$

$$S_{12} = 0 \quad \text{(Eq. 2e)}$$

$$S_{21} = \left[ 4 \frac{R_c}{Z_o} + \frac{Z_o}{R_c} + j \frac{1}{2} \sqrt{2} \right] (g_m Z_o)^2 \quad \text{(Eq. 2f)}$$

At $\Omega=0$ we have the case of n devices in parallel resulting in a simple expression for the $S_{21}$-parameter.

At $\Omega=\sqrt{2}$ the $S_{21}$ parameter for n=4 (equation 2f) is very much dependent on $R_c/Z_o$ and approaches infinity for $R_c/Z_o=0$ and $R_c/Z_o=\infty$. Minimum gain $|S_{21}|^2$ occurs at $R_c/Z_o=\frac{1}{2}$ while minimum gain variation across the frequency band is found at $R_c/Z_o=1$.

Figure 4:
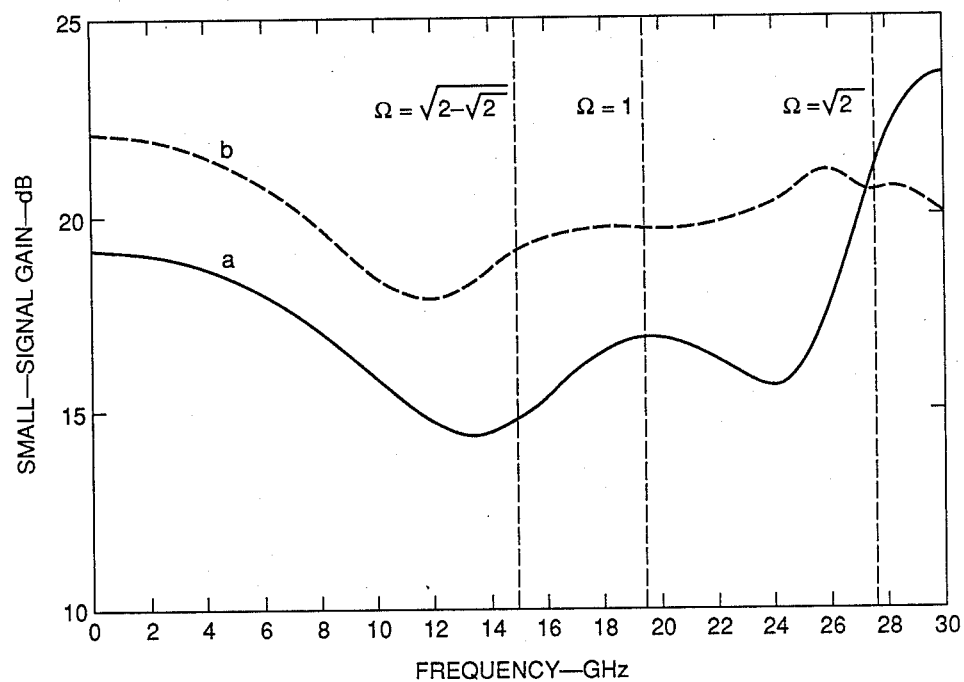
FIG. 4 is plot of the small frequency gain, as a function of input signal frequency, for the circuit models in FIGS. 3b–c.

Curve (a) in FIG. 4 displays the frequency response of the amplifier's gain for n=4, $g_m=30$ mS, C=0.163 pF, L=0.4075 nH and $R_c=Z_o=50$ ohms. The capacitance $C=C_{gs}+C_{ds}$ and the transconductance $g_m$ were taken from S-parameter measurements of an exemplary device, whose equivalent circuit will be discussed below with respect to FIG. 9.

Since all the parasitics, except for $C_{gs}$ and $C_{ds}$, have been removed from the idealized amplifier modeled in FIG. 3B, the gain response, of course, extends far beyond the frequencies that the actual GaAs MESFET is able to cover. As explained below in the section entitled "Design Considerations", the upper limit of the frequency band when using practical devices is located somewhere between $\Omega=1$ and $\Omega=2$. For this reason it is useful to determine the S parameters of the 2×4 array of FIG. 3B at $\Omega=1$. They are:

$\Omega=1$ and n=4

$$S_{11} = S_{22} = \frac{-j}{4+j7} \quad \text{(Eq. 2g)}$$

$$S_{12} = 0 \quad \text{(Eq. 2h)}$$

$$S_{21} = \quad \text{(Eq. 2i)}$$

$$\frac{4(g_mZ_o)^2}{(1+j7/4)^2}\left[2\frac{[(R_c/Z_o+1/4)+j(R_c/Z_o+1)]^2}{R_c/Z_o+j((R_c/Z_o)^2+3/4)} - \left(1+j\frac{9}{4}\right)\right]$$

Figure 3C:
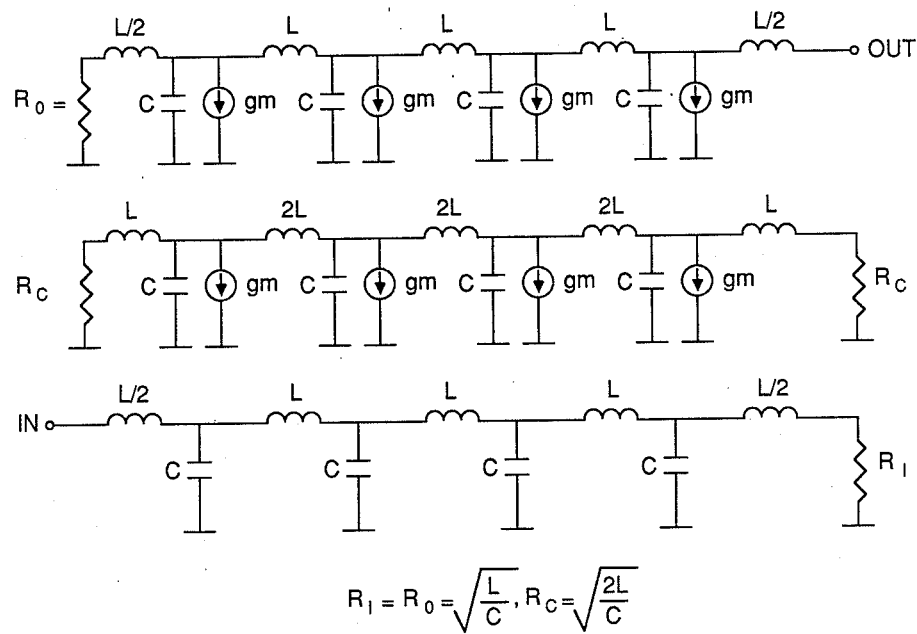

The gain and the gain flatness of the idealized amplifier shown in FIG. 3B can be improved by doubling the inductance of the links in the center line in accordance with the circuit of FIG. 3C. Since no changes were made in either the gate or the drain transmission line, the input and output reflection coefficients are again zero at $\Omega=0$, $\Omega=2-\sqrt{2}$, $\Omega=2$, and $\Omega=\sqrt{2+\sqrt{2}}$ In case of $\Omega=0$ the S-parameters are identical to those of equations 2a-2c while for $\Omega=\sqrt{2}$ they are expressed by $\Omega=\sqrt{2}$ and n=4

$$S_{11} = S_{22} = 0 \quad \text{(Eq. 3a)}$$

$$S_{12} = 0 \quad \text{(Eq. 3b)}$$

$$S_{21} = \frac{12R_c/Z_o + j7\sqrt{2}}{1-j2\sqrt{2}\,R_c/Z_o}(g_mZ_o)^2 \quad \text{(Eq. 3c)}$$

From equations 3a-3c it becomes immediately apparent that, in contrast to the circuit of FIG. 3B, the gain of the circuit in FIG. 3C is finite for $R_c/Z_o=0$ and $R_c/Z_o=\infty$. As can be seen from curve (b) in FIG. 4 for n=4, gm=30 mS, C=0.163 pF, L=0.4075 nH and $R_c/Z_o=\sqrt{2}$, both the average gain and the total gain variation between $\Omega=0$ and $\Omega=\sqrt{2}$, even though not ideal, have significantly improved over those of the circuit in FIG. 3B.

Figure 3D:
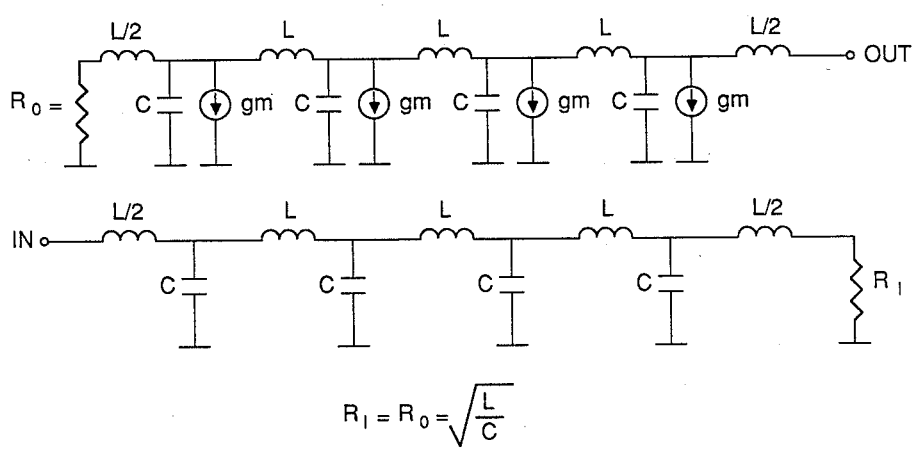

In order to dramatize the dual nature (i.e., multiplicative and additive amplification characteristics) of the matrix amplifier, a comparison of its S parameters at certain frequencies with those of an equivalent distributed amplifier follows. The schematic of the latter is shown in FIG. 3D. Again, for $\Omega=0$ and $\Omega=\sqrt{2}$ the input and output reflection coefficients are zero. However, the input and output shunt capacitances are now $C=C_{gs}$ (if $C_{gs}>C_{ds}$) or $C=C_{ds}$ (if $C_{ds}>C_{gs}$), which in accordance with equation 1b, results in a lower inductivity L ($Z_o=50$ ohms) and, therefore, in a slightly higher bandwidth. The S parameters of the idealized distributed amplifier in FIG. 3D at the normalized frequencies $\Omega=0$ and $\Omega=\sqrt{2}$ are:

$\Omega=0$:

$$S_{11} = S_{22} = 0 \quad \text{(Eq. 4a)}$$

$$S_{12} = 0 \quad \text{(Eq. 4b)}$$

$$S_{21} = -\frac{n}{2}g_mZ_o \quad \text{(Eq. 4c)}$$

$\Omega=\sqrt{2}$ and n=4:

$$S_{11} = S_{22} = 0 \quad \text{(Eq. 4d)}$$

$$S_{12} = 0 \quad \text{(Eq. 4e)}$$

$$S_{21} = -3g_mZ_o \quad \text{(Eq. 4f)}$$

A comparison of equations 2c and 2f with equations 4c and 4f shows the multiplicative property of the matrix amplifier, which is reflected in the term $(g_mZ_o)^2$.

In order to compare the performance of a matrix amplifier of n links and m multiplicative tiers (n=4 and m=2 in FIGS. 3B and 3C) with an equivalent distributed amplifier the latter has to consist of n links and m cascaded stages. Such a comparison, however, is not very meaningful when performed for the idealized cases we have treated so far. Therefore this comparison is described below, after the description of the matrix amplifier's performance based on actually measured devices. In conclusion, the above analysis demonstrates the dual nature of the matrix amplifier's functions, i.e., additive and multiplicative amplification in one and the same module.

DESIGN CONSIDERATIONS

Figure 5:
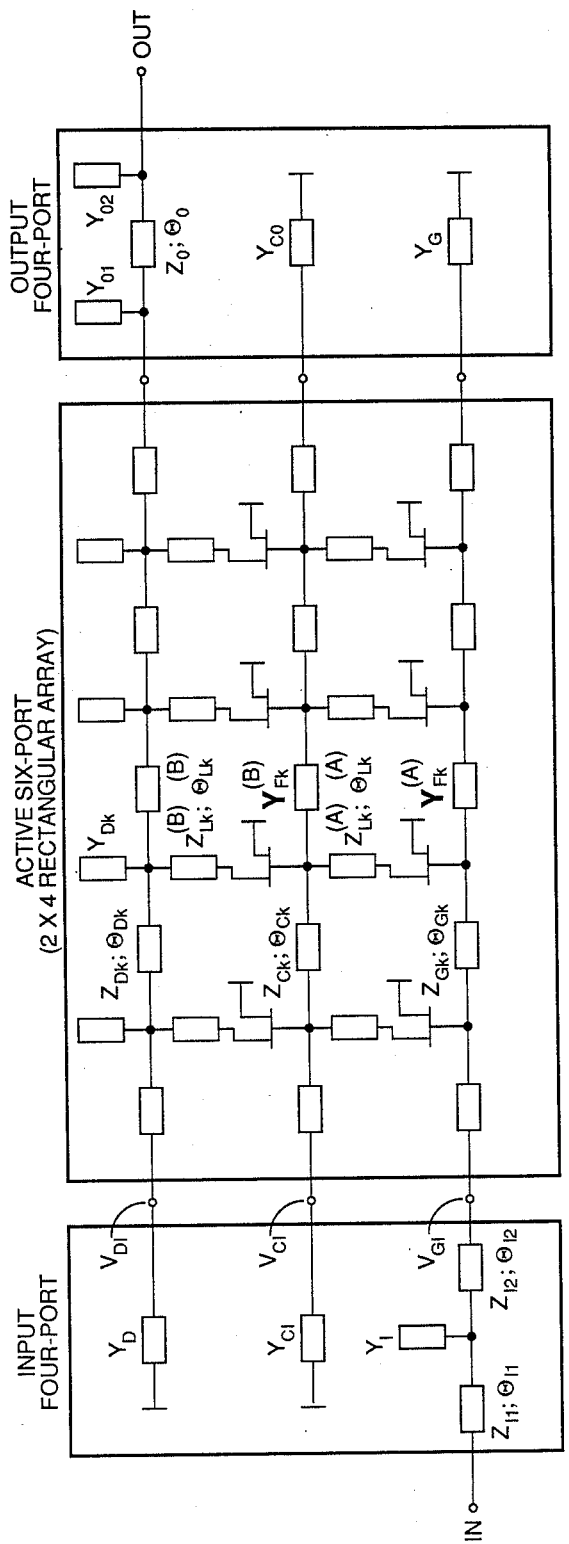
FIG. 5 depicts the major circuit blocks of an exemplary ($2 \times 4$ array) matrix amplifier in its unabridged form.

Analytical Tools The schematic of the preferred embodiment, a matrix amplifier incorporating the actual circuit elements is shown in FIG. 5. It consists of three major blocks: the active six-port transistor block, flanked by a four port input block and a four port output block.

The active six-port incorporates the transistors characterized by their sets of Y-parameters, the network of inductances (not shown in FIG. 5) or transmission line elements represented by their respective characteristic impedances and line lengths and the open circuit shunt stubs capacitively loadiang the drain line. In contrast, the input and output four-ports contain only passive circuit elements, i.e., the terminations of the amplifier's idle ports and a simple input and output matching network.

The follow is a formation of a number of matrix equations that are useful to compute the characteristics of the amplifier. As mentioned earlier, the analysis will be performed by means of the 2×4 array as shown in FIG. 5, but may be expanded to m multiplicative tiers, resulting in square matrices composed of $(2m+2)^2$ elements. In the case of the 2×4 array analyzed here, we have m=2 tiers leading to a set of 6×6 matrices which when multiplied make it possible to compute the input and output voltages and currents of our device. The matrix equation describing the voltages and currents of a matrix amplifier (with m=2 multiplicative tiers) consisting of p elementary six-ports is of the form:

$$\begin{bmatrix} V_{D0} \\ I_{D0} \\ V_{C0} \\ I_{C0} \\ V_{G0} \\ I_{G0} \end{bmatrix} = \prod_{k=0}^{k=p} A_k \begin{bmatrix} V_{Dn} \\ -I_{Dn} \\ V_{Cn} \\ -I_{Cn} \\ V_{Gn} \\ -I_{Gn} \end{bmatrix}$$ (Eq. 5)

Figure 6:
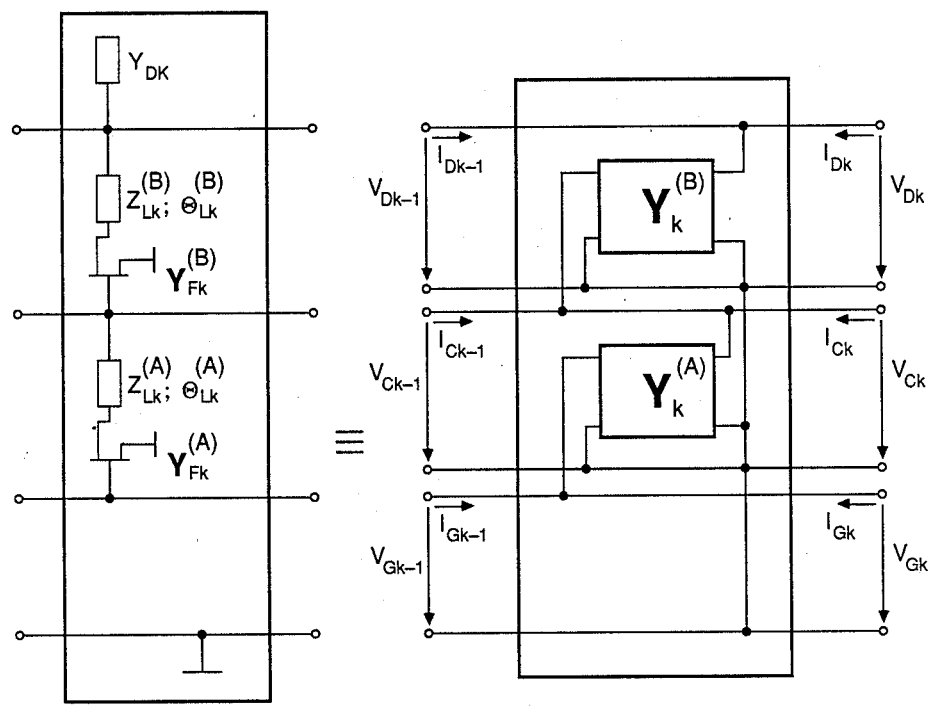
FIG. 6 depicts how a two-tier active six-port circuit block is modeled.
Figures 7A, 7B:
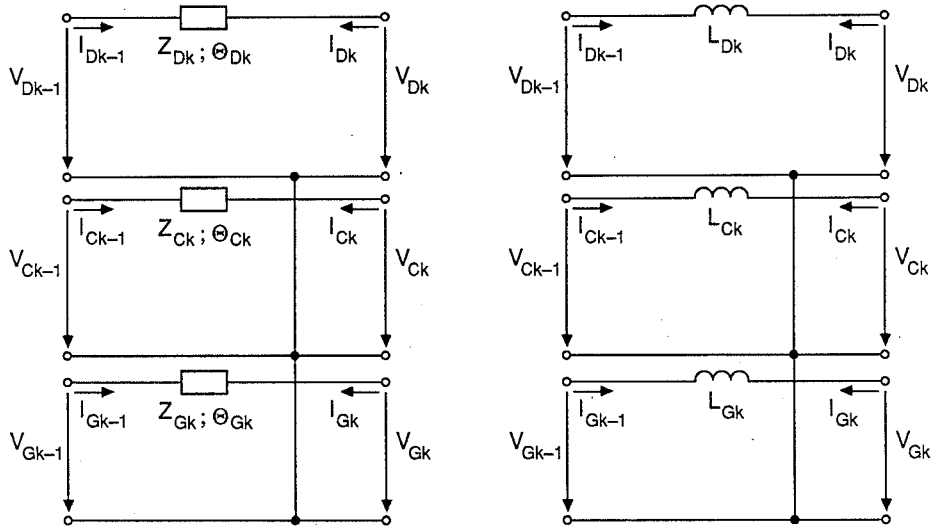
FIGS. 7a–b depict how the links in a six-port circuit are modeled using transmission line elements (a), and inductors (b), respectively.
Figure 8A:
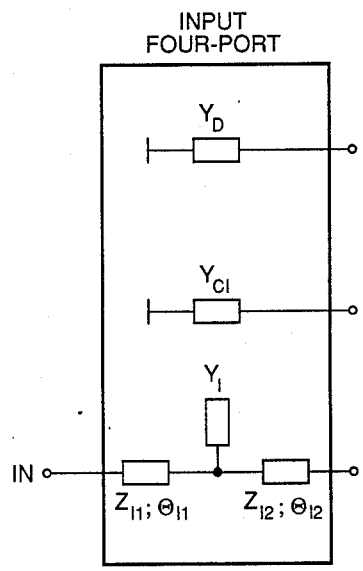
FIGS. 8a–b depict the circuit elememts for modeling the input (a) and output four-port circuits (b).
Figure 8B:
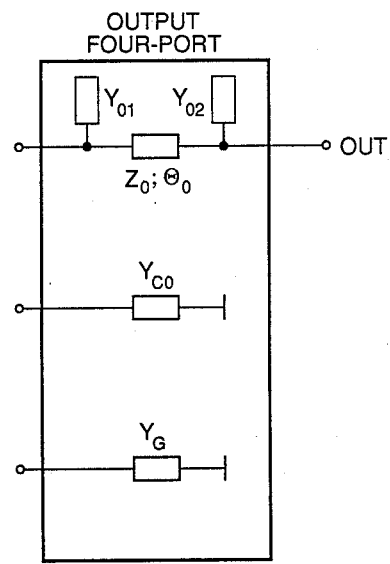

Here, as in equation 1, subscripts 0 and n indicate the input and output quantities, respectively. The matrix (equation 5) results from the multiplication of all matrices $A_k$ that characterize the elementary six-ports which have been cascaded between the terminals of the amplifier. For example, the characteristics of the two-tier active six-port of FIG. 6 are represented in the matrix (A1) of the Appendix. Similarly, those of the transmission line elements in FIG. 7a are reflected in the matrix (A2), while those of the inductive links in FIG. 7b may be determined with (A3). Finally, the characteristics of the input and output four ports in FIG. 8a and FIG. 8b are expressed by the matrices (A4) and (A5), respectively.

Once the idle ports of the amplifier are terminated in accordance with FIG. 5 and the matrices of all elementary six-ports have been multiplied in the sequence they are cascaded, the resulting matrix equation may be reduced to that of a two port:

$$\begin{bmatrix} I_{G0} \\ I_{Dn} \end{bmatrix} = \begin{bmatrix} Y_{11}^{(MA)} & Y_{12}^{(MA)} \\ Y_{21}^{(MA)} & Y_{22}^{(MA)} \end{bmatrix} \begin{bmatrix} V_{G0} \\ V_{Dn} \end{bmatrix}$$ (Eq. 6)

The admittance parameters $Y_{ij}^{(MA)}$ of this two port equation are presented in equations A7a-c of the appendix. They can be used to formulate the gain, the reflection coefficients and the reverse isolation of the amplifier. As to the involvement of multiplying a great number of matrices of the complexity represented by equations A1-A5 in the appendix, when actual MESFETs are employed, the use of a computer greatly simplifies this task. The computations, of course, can be executed with commercially available computer programs that are based on nodal analysis.

The use of equations A1-A7 in the appendix leads us to the exact solution and the admittance parameters, however, their complexity gives us no immediate clue on the amplification principle of the device. To obtain a descriptive set of Y-parameters we take a very brief look at the amplifier's low frequency model. At low frequencies where the internal feedback of the transistors and the influence of the linking elements may be neglected (in our case f≦2 GHz), the expressions of the admittance parameters (A7) for the case that identical devices are employed in rows A and B take the simple and interpretive form:

$$Y_{11}^{(MA)} \simeq Y_G + n\, Y_{11}^{(A)}$$ (Eq. 7a)

$$Y_{12}^{(MA)} \simeq 0$$ (Eq. 7b)

$$Y_{21}^{(MA)} \simeq -\frac{n^2\, Y_{21}^{(A)} Y_{21}^{(B)}}{Y_{CI} + Y_{CO} + n(Y_{11}^{(B)} + Y_{22}^{(A)})}$$ (Eq. 7c)

$$Y_{22}^{(MA)} \simeq Y_D + n\, Y_{22}^{(B)}$$ (Eq. 7d)

Figure 9:
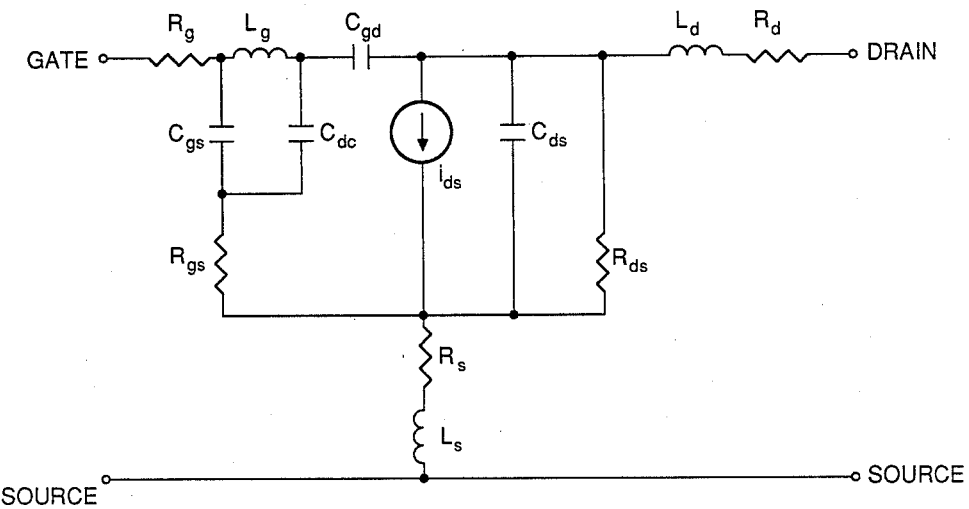
FIG. 9 is a schematic for the equivalent circuit and circuit elements of a GaAs field effect transistor.

Effects of the Device Parasitics For the purpose of looking at the effects of device parasitics, the idealized active device shown in FIG. 3A will be replaced by a GaAs MESFET characterized by the equivalent circuit elements shown in FIG. 9. The circuit element values shown in FIG. 9 are based on S-parameter measurements performed on a transistor incorporating a 0.25×200 micron gate having a peak doping of $5.7\times 10^{17}$ cm$^{-3}$. The data is representative of the devices that were used in experimental matrix amplifiers.

Figure 10:
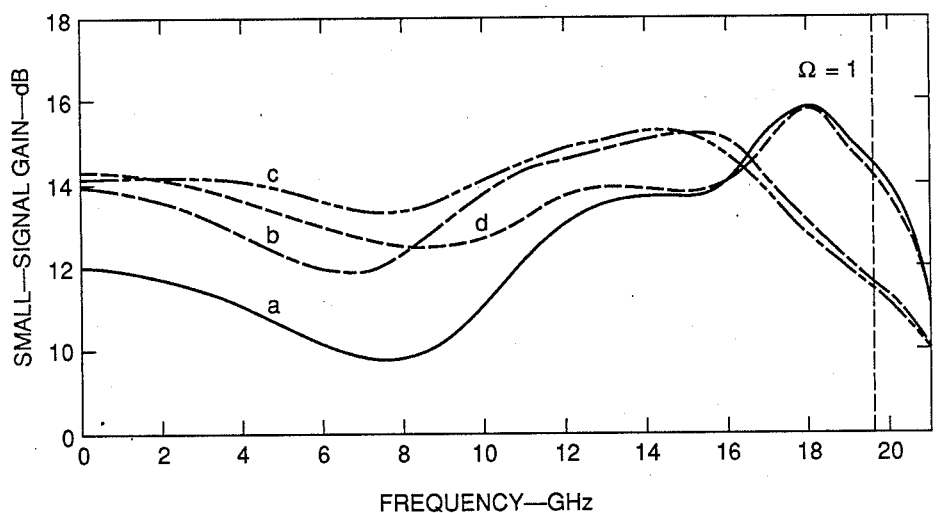
FIG. 10 is a plot of the small signal gain of the exemplary $2 \times 4$ matrix amplifier when employing the device of FIG. 9 and four different sets of circuit component values.

The computed gains are plotted in curve (a) of FIG. 10 for the case for which all inductive links are identical as is the case in the circuit of FIG. 3B. The gains represented by curve (a) in FIG. 10 were computed using $L_G=L_C=L_D=0.4075$ nH (nanohenries), $C_G=C_C=0$, $C_D=0.1385$ pF (C=0.163 pF), and $R_G=R_{C1}=R_{C2}=R_D=50$ ohm.

Comparing the curves (a) in FIG. 2 and FIG. 10 reveals the immense influence that the GaAs MESFETs' parasitics exert on the module's gain performance. Not only has the circuit's small-signal gain been significantly affected, but, in addition, its bandwidth has suffered severely. Obviously this comparison renders our study of the simplified circuit in the previous chapter a qualitative analysis at best. However, as stated previously, the intent was to demonstrate in descriptive terms the matrix amplifier's dual nature.

A similar discrepancy becomes apparent when we compare the circuits that use twice the inductance in the center line in accordance with FIG. 3C. Again, the small-signal gain and the bandwidth experience a significant decline due to the transistor's parasitic elements as demonstrated by curves (b) in FIG. 4 and FIG. 10, both computed using $L_G=\frac{1}{2}$ $L_C=L_D=0.4075$ nH, $C_G=C_C=0$, $C_D=0.1385$ pF (C=0.163 pF), $R_G=R_D=50$ ohm, and $R_{C1}=R_{C2}=70.7$ ohm.

The gain variation of the simple circuits represented by the schematics in FIGS. 3B and 3C however, may be improved by altering the inductors linking the active devices.

PERFORMANCE IMPROVEMENTS

The gain variations produced by the simple circuits represented by the schematics of FIGS. 3B and 3C after the idealized devices (FIG. 3A) have been replaced by practical GaAs MESFETs (FIG. 9) are not acceptable and need improvement. Simple adjustments in the values of the idle ports' terminations, the linking inductors and the loadiang capacitors produce the changes displayed by the gain patterns of curves (c) and (d) of FIG. 10. Curve (c) was computed using $L_G=\frac{1}{2}L_C=L_D=0.4325$ nH, $C_G=C_C=0$, $C_D=0.105$ pF, $R_G=37$ ohm $R_D=90$ ohm, $R_{C1}=135$ ohm, and $R_{C2}=50$ ohm. Curve (d) was computed using $L_G=L_C=L_D 0.385$ nH, $C_G=C_C 0$, $C_D=0.081$ pF, $R_G=30$ ohm, $R_D=110$ ohm, $R_{C1}=325$ ohm, and $R_{C2}=50$ ohm.

If, however, a further enhancement of performance is desired, the use of identical active six port elements has to be abandoned, i.e., all linking elements as well as all capacitive loads need to be subjected to individual optimization. Furthermore, simple input and output matching networks must be added to improve the matrix amplifier's input and output matches. In addition, it becomes necessary to insert series inductive elements, i.e., inductors or high impedance transmission line elements between the drain terminals of the active devices and their respective linking elements.

Figure 11:
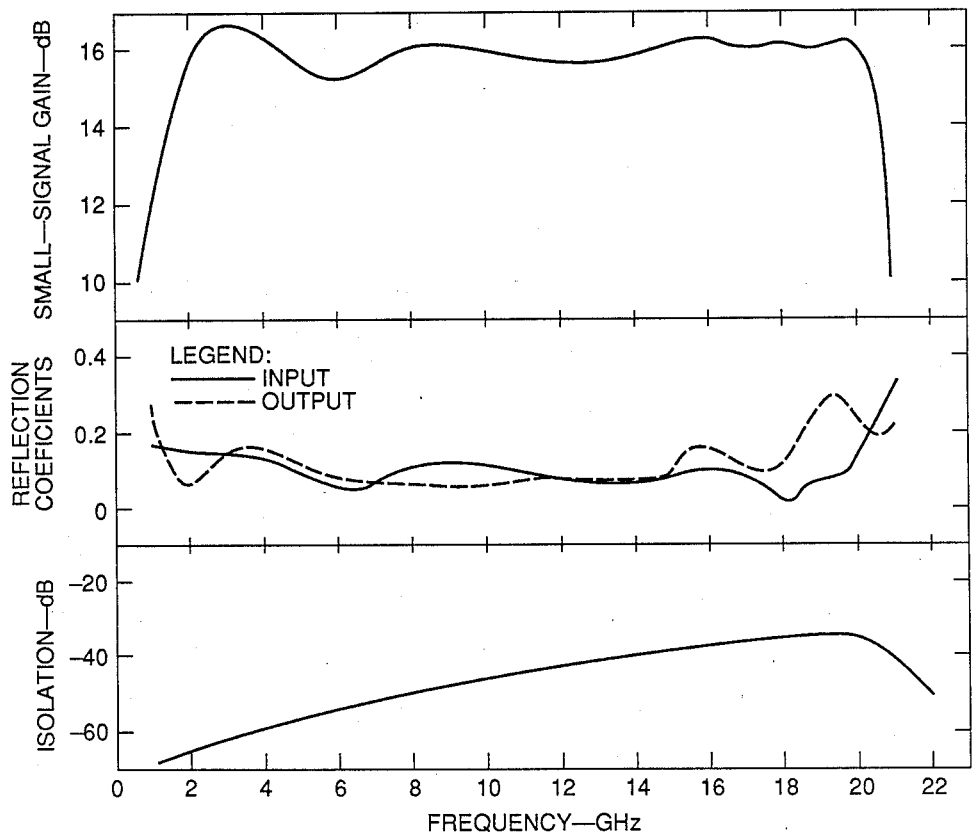
FIG. 11 is a plot of the computed performance characteristics of the matrix amplifier shown in FIG. 1.

FIG. 2 shows the schematic of the resulting 2×4 matrix amplifier whose practical realization is reflected in the photograph of FIG. 2A. The amplifier employs the device characterized by the equivalent circuit and its elements of FIG. 9. It can be seen from FIG. 2A that, due to the optimization applied to all circuit elements, hardly any are identical in length when compared to their peers located in equivalent positions. The module's computed small-signal gain, reflection coefficients and reverse isolation are shown in FIG. 11. A comparison with the gain curves (d) for identical links in FIG. 10 reveals significant improvements in both absolute gain and the amount of gain variation justifying the effort of individual circuit element optimization. For a discussion of the techniques used to optimize circuit elements in a distributed amplifier, see K. B. Niclas, R. D. Remba, R. R. Pereira, and B. D. Cantos, "The Declining Drain Line Lengths Circuit - A Computer Derived Design Concept Applied to a 2-26.5 GHz Distributed Amplifier", IEEE Trans. Microwave Theory Tech, Vol. MTT-34, April 1986.

Figure 12:
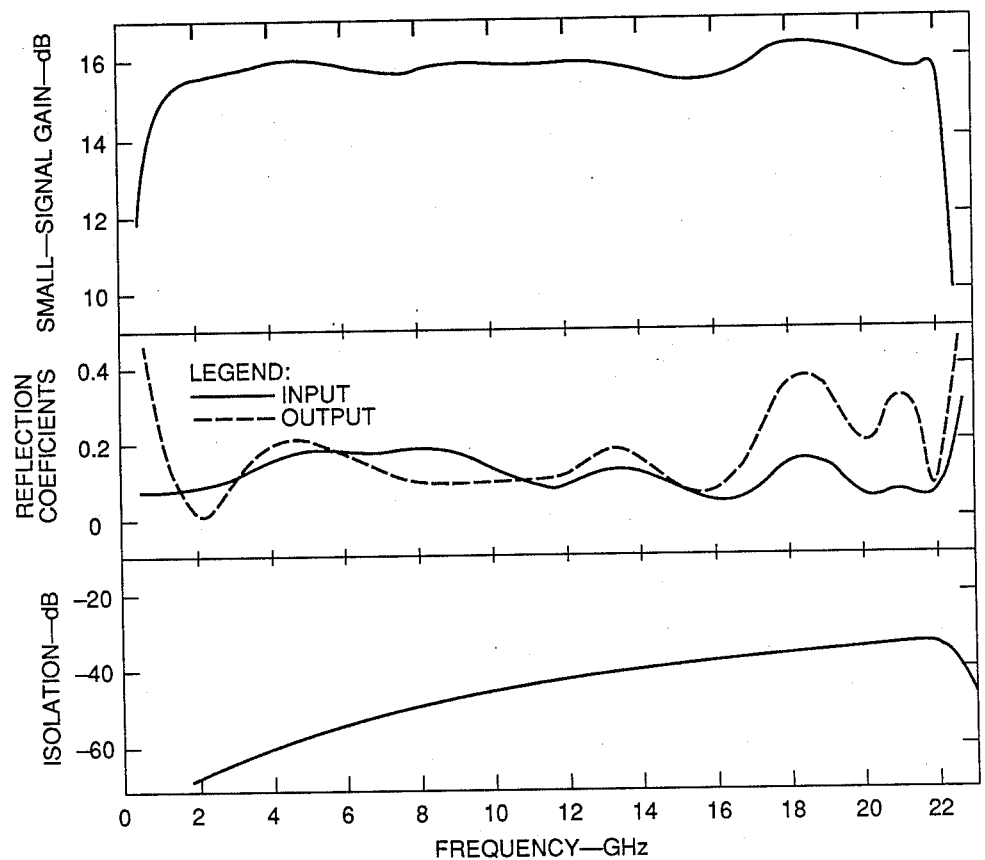
FIG. 12 is a plot of the computed performance characteristics of an optimized two-stage distributed amplifier.

Since cascading two distributed amplifiers also combines the gain of each module through multiplication, it is of considerable interest how the perfomance of our 2×4 matrix amplifier compares to a unit consisting of two cascaded distributed amplifier modules using the same number and type of transistors. In order to achieve a meaningful comparison, all circuit elements of each of the identical stages are individually optimized to produce the best two-stage amplifier performance. The results are plotted in FIG. 12. Comparing the data of FIG. 11 with that of FIG. 12 clearly shows that while both amplifiers have similar gain levels, the gain variation and the bandwidth of the two-stage amplifier, as expected, are superior. However, the input and output reflection coefficients of the matrix amplifier exhibit somewhat lower levels than those of the two stage unit.

In contrast to the moderate improvements of the reflection coefficients computed for the matrix amplifier over those of the two-stage distributed amplifier, measured data decisively demonstrates the better performance of the matrix amplifier. On the basis of the above data comparison alone, it is hard to justify the effort required to design an optimized matrix amplifier. However, when drawing a comparison between the sizes of both units, the matrix amplifier has the clear edge. The overall circuit area is approximately 65% that of the two-stage amplifier. This is a significant advantage wherever size and, for monolithic devices, cost, are of great importance. In addition, better noise figures may be expected by using the matrix amplifier.

The high concentration of active devices in the center section of the matrix amplifier as shown in FIG. 2A makes this portion of the circuit especially suited for monolithic technology and, due to the fact that it occupies only a small fraction of the entire amplifier, very cost effective. The area consuming drain line circuitry may then be fabricated on substrate material other than GaAs which retains the option of tuning this sensitive part of the amplifier.

EXPERIMENTAL RESULTS

Figure 13:
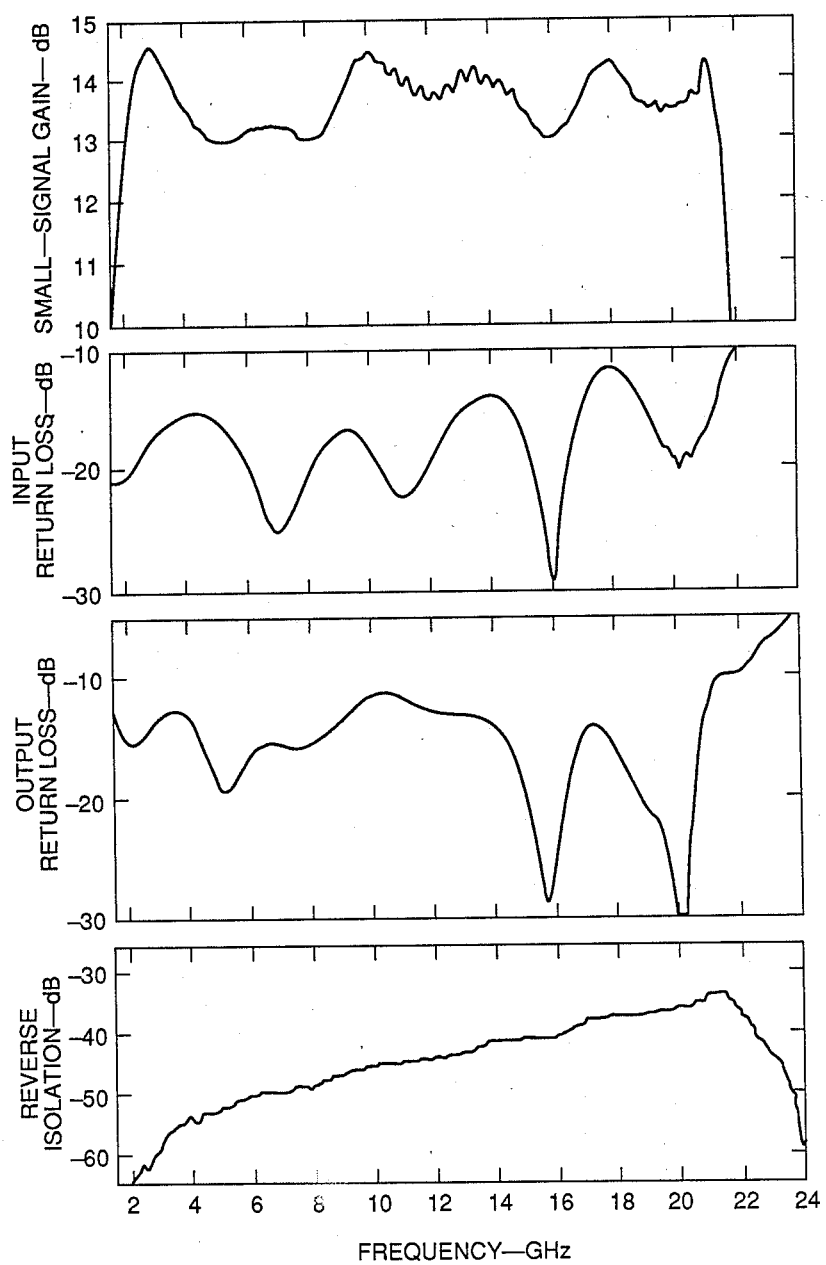
FIG. 13 is a plot of the measured performance of the experimental amplifier employing MESFETs manufactured on ion implanted material.

The layout of the experimental matrix amplifier is show in FIG. 2A. The overall circuit size is 0.500×0.240 inches and 10 mil thick quartz was used for substrate material. The unit is self-biased and only one dc voltage (12 Volts) was supplied to a simple voltage divider which, in this amplifier, is located outside the amplifier housing. The sum of all drain currents totalled 304 mA. The amplifier's small-signal gain, return losses and reverse isolation are plotted in FIG. 13. From 2.0 GHz to 21.5 GHz, the small-signal gain is $G=13.8+/-0.8$ dB, with a worst return loss of $-11.7$ dB for the input port and $-11.4$ dB for the output port. The reverse isolation ranges from a minimum of $-33.2$ dB to a maximum of $-66$ dB across the 19.5 GHz band. For comparison, the computed small-signal gain (FIG. 13) is $G=15.9+/-0.7$ dB over the slightly narrower 2 GHz to 20.0 GHz frequency band. A maximum noise figure of $NF=8.0$ dB between 2.0 GHz and 20.0 GHz and a minimum output power of 17.0 dBm at the 1 dB compression points between 2.0 GHz and 21.0 GHz were measured. The amplifier's large signal gain at 100 mW of output power is $G=11.6+/-1.5$ dB from 2 GHz to 21 GHz. The maximum harmonic output power at the 1 dB compression points is generated by the first harmonic and is 21 dB below the fundamental output power at $f_o=2$ GHz.

Figure 14:
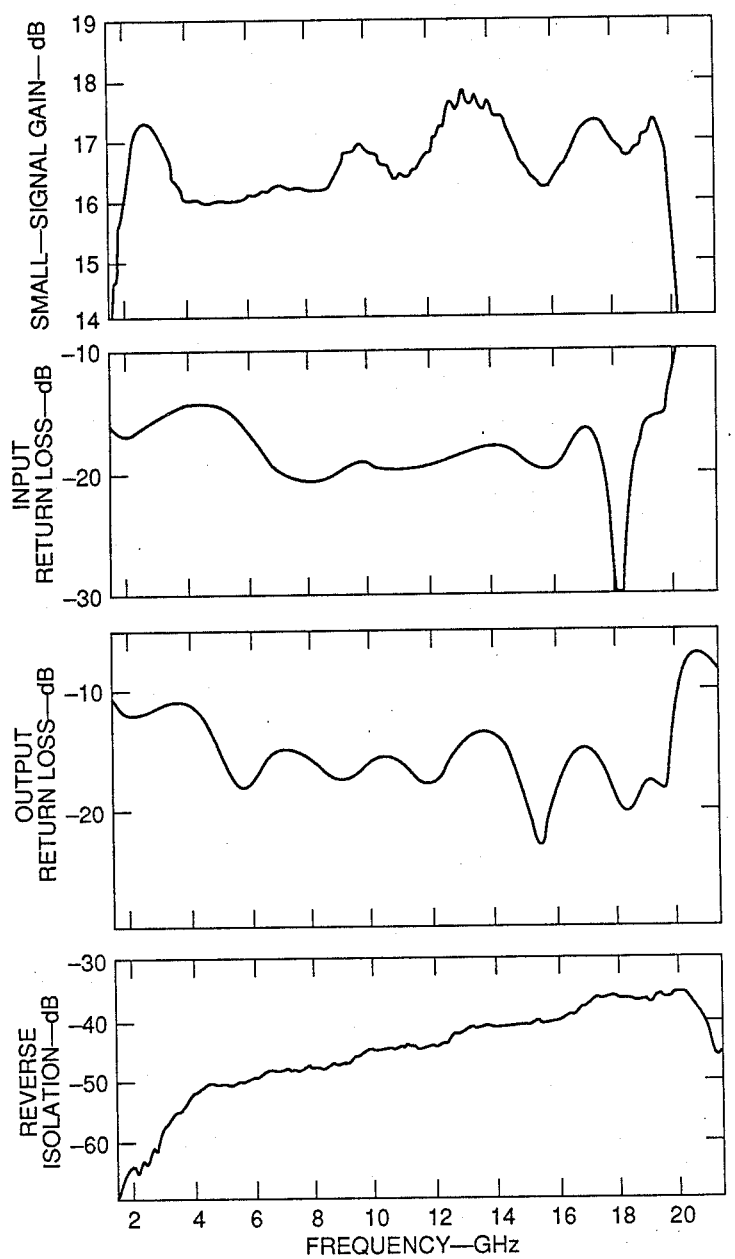
FIG. 14 is a plot of the measured performance of the experimental amplifier using MESFETs manufactured on vaport-epitaxial material.

As shown in FIG. 14, subsequent amplifiers incorporating GaAs MESFETs fabricated with the same mask set, however, on vapor-phase epitaxial rather than ion implanted material, yield $G=16.3+/-0.9$ dB of small-signal gain over the slightly narrower 2.3-20.3 GHz frequency band using the same basic circuit as shown in FIGS. 2 and 2A. A maximum noise figure of $NF=6.6$ dB was measured between 2.5 GHz and 18 GHz and $NF=5.1$ dB from 8 GHz to 18 GHz. In contrast to the ion implanted substrate's peak doping of $N=6\times10^{17}$ cm$^{-3}$ at a depth of 0.1 micron the vapor phase epitaxial substrate's doping is $N=4\times10^{17}$ cm$^{-3}$ with a 90% level at a depth of 0.2 micron. See B. D. Cantos and R. D. Remba, "A Reliable Method for 0.25 um Gate MESFET Fabrication Using Optical Photolithography", paper presented at the 169th Meeting of the Electromechanical Society, Boston, May 1986.

CONCLUSION

A new type of amplifier has been described which combines additive and multiplicative amplification. The matrix amplifier has cost and size advantages over the use of the closest equivalent cascaded distributed amplifier, especially when monolithic technology is used. In addition, the matrix amplifier has better reflection coefficients and noise figures, higher gain, and the ability to separately bias each row of devices by means of linking elements. Due to the initial encouraging results and the vast number of options offered by the new concept, the 2×4 array described here may be only the first representative of an emerging class of amplifiers.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

APPENDIX

Voltages, Currents, and Y-Parameters of the Two-Tiered Matrix Amplifier

The circuit shown in the schematic of FIG. 5 serves as a representative example of a matrix amplifier that contains m=2 tiers of active devices. For ease of a rigorous analysis it is expedient to divide this network into sub-circuits that can be represented by relatively uncomplicated equations for the voltages and the currents at the terminals of the ensuing six-ports. For convenience we have chosen five types of six-ports that satisfy the requirements imposed by the possible sub-circuits of the matrix amplifier in FIG. 5. They are the two-tier active six-port of FIG. 6, the six-port links composed of transmission line elements or inductors of FIGS. 7a and 7b and, finally, the input and output four-ports of FIGS. 8a and 8b, respectively. Each of the described six-ports may be represented by a quadratic matrix. Following in above order, the matrix equation of the two-tiered active six-port is:

$$\begin{bmatrix} V_{Dk-1} \\ I_{Dk-1} \\ V_{Ck-1} \\ I_{Ck-1} \\ V_{Gk-1} \\ I_{Gk-1} \end{bmatrix} = \begin{bmatrix} 1 & 0 & 0 & 0 & 0 & 0 \\ Y_{22k}^{(B)} & 1 & Y_{21}^{(B)} & 0 & 0 & 0 \\ 0 & 0 & 1 & 0 & 0 & 0 \\ Y_{12}^{(B)} & 0 & (Y_{11k}^{(B)} + Y_{22}^{(A)}) & 1 & Y_{21}^{(A)} & 0 \\ 0 & 0 & 0 & 0 & 1 & 0 \\ 0 & 0 & Y_{12k}^{(A)} & 0 & Y_{11}^{(A)} & 1 \end{bmatrix} \begin{bmatrix} V_{Dk} \\ -I_{Dk} \\ V_{Ck} \\ -I_{Ck} \\ V_{Gk} \\ -I_{Gk} \end{bmatrix}$$ (Eq. A1)

Figure 15:
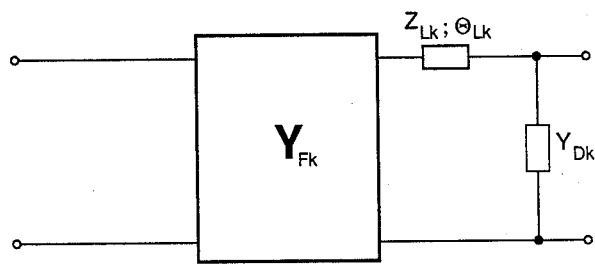
FIG. 15 depicts the model for an active device (e.g., a GaAs field effect transistor) with an output transformer and a capacitive load.

The admittances $Y_{ijk}$ contain the transmission line elements inserted between the transistors' drain terminals and the nodes connecting the linking elements with the capacitive loads $Y_{Dk}$ (FIG. 15). If $Y_{ijFk}$ are the transistors' admittances and $Z_{Lk}$ the characteristic impedances and $\Theta_{Lk}$ the electrical lengths of the inserted line transformers, then we obtain the admittances for both tiers (A) and (B) of the $k^{th}$ active six-port with:

$$Y_{11k} = Y_{11FK} - j \frac{Y_{12Fk} Y_{21Fk} Z_{Lk} \tan\Theta_{Lk}}{1 + jY_{22Fk} Z_{Lk} \tan\Theta_{Lk}}$$ (Eq. A1a)

$$Y_{12k} = \frac{Y_{12Fk}}{\cos\Theta_{Lk} + jY_{22Fk} Z_{Lk} \sin\Theta_{Lk}}$$ (Eq. A1b)

$$Y_{21k} = \frac{Y_{21Fk}}{\cos\Theta_{Lk} + jY_{22Fk} Z_{Lk} \sin\Theta_{Lk}}$$ (Eq. A1c)

$$Y_{22k} = Y_{Dk} + \frac{1}{Z_{Lk}} \frac{Y_{22Fk} Z_{Lk} j\tan\Theta_{Lk}}{1 + jY_{22Fk} Z_{Lk} \tan\Theta_{Lk}}$$ (Eq. A1d)

The six-port links composed of transmission line elements are transforming the voltages and the currents in accordance with Equation A2:

$$\begin{bmatrix} V_{Dk-1} \\ I_{Dk-1} \\ V_{Ck-1} \\ I_{Ck-1} \\ V_{Gk-1} \\ I_{Gk-1} \end{bmatrix} = \begin{bmatrix} \cos\theta_{Dk} & jZ_{Dk}\sin\theta_{Dk} & 0 & 0 & 0 & 0 \\ \frac{j}{Z_{Dk}}\sin\theta_{Dk} & \cos\theta_{Dk} & 0 & 0 & 0 & 0 \\ 0 & 0 & \cos\theta_{Ck} & jZ_{Ck}\sin\theta_{Ck} & 0 & 0 \\ 0 & 0 & \frac{j}{Z_{Ck}}\sin\theta_{Ck} & \cos\theta_{Ck} & 0 & 0 \\ 0 & 0 & 0 & 0 & \cos\theta_{Gk} & jZ_{Gk}\sin\theta_{Gk} \\ 0 & 0 & 0 & 0 & \frac{j}{Z_{Gk}}\sin\theta_{Gk} & \cos\theta_{Gk} \end{bmatrix} \begin{bmatrix} V_{Dk} \\ -I_{Dk} \\ V_{Ck} \\ -I_{Ck} \\ V_{Gk} \\ -I_{Gk} \end{bmatrix}$$

In those cases for which the linking elements are inductivities we have:

$$\begin{bmatrix} V_{Dk-1} \\ I_{Dk-1} \\ V_{Ck-1} \\ I_{Ck-1} \\ V_{Gk-1} \\ I_{Gk-1} \end{bmatrix} = \begin{bmatrix} 1 & j\omega L_{Dk} & 0 & 0 & 0 & 0 \\ 0 & 1 & 0 & 0 & 0 & 0 \\ 0 & 0 & 1 & j\omega L_{Ck} & 0 & 0 \\ 0 & 0 & 0 & 1 & 0 & 0 \\ 0 & 0 & 0 & 0 & 1 & j\omega L_{Gk} \\ 0 & 0 & 0 & 0 & 0 & 1 \end{bmatrix} \begin{bmatrix} V_{Dk} \\ -I_{Dk} \\ V_{Ck} \\ -I_{Ck} \\ V_{Gk} \\ -I_{Gk} \end{bmatrix}$$ (Eq. A3)

If $A_I$, $B_I$, $C_I$, and $D_I$ are the chain parameters of the input matching network and $A_O$, $B_O$, $C_O$, and $D_O$ those of the output matching network, the voltages and currents at the input and output terminals may be calculated with:

$$\begin{bmatrix} V_{D0} \\ -Y_D V_{D0} \\ V_{C0} \\ -Y_{CI} V_{C0} \\ V_{G0} \\ I_{G0} \end{bmatrix} = \begin{bmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \\ 0 & 0 & 0 & 0 & A_I & B_I \\ 0 & 0 & 0 & 0 & C_I & D_I \end{bmatrix} \begin{bmatrix} V_{D1} \\ -I_{D1} \\ V_{C1} \\ -I_{C1} \\ V_{G1} \\ -I_{G1} \end{bmatrix}$$ (Eq. A4)

for the input, and:

$$\begin{bmatrix} V_{Dn-1} \\ I_{Dn-1} \\ V_{Cn-1} \\ I_{Cn-1} \\ V_{Gn-1} \\ I_{Gn-1} \end{bmatrix} \begin{bmatrix} A_0 & B_0 & 0 & 0 & 0 & 0 \\ C_0 & D_0 & 0 & 0 & 0 & 0 \\ 0 & 0 & 1 & 0 & 0 & 0 \\ 0 & 0 & 0 & 1 & 0 & 0 \\ 0 & 0 & 0 & 0 & 1 & 0 \\ 0 & 0 & 0 & 0 & 0 & 1 \end{bmatrix} \begin{bmatrix} V_{Dn} \\ -I_{Dn} \\ V_{Cn} \\ Y_{C0} V_{Cn} \\ V_{Gn} \\ Y_G V_{Gn} \end{bmatrix}$$ (Eq. A5)

for the output terminal.

Finally, the individual 6×6 matrices arranged in the order of the elementary six-ports are cascaded and multiplied in accordance with equation 5. This step leads directly to the input and output voltages as well as currents of the matrix amplifier.

The amplifier's idle ports are terminated as shown in FIG. 5. In accordance with these boundary conditions (equations 1c–1f) which are reflected in the matrices (A4) and (A5), we are able to reduce the six-port representation of equation 5 to the more familiar two-port equations (7) that usually characterize an amplifier. The multiplication of the matrices of the elementary six-ports leads us to the six-port matrix that contains the boundary conditions:

$$\begin{bmatrix} V_{D0} \\ -Y_D V_{D0} \\ V_{C0} \\ -Y_{CI} V_{C0} \\ V_{G0} \\ I_{G0} \end{bmatrix} = [A] \begin{bmatrix} V_{Dn} \\ -I_{Dn} \\ V_{Cn} \\ Y_{C0} V_{Cn} \\ V_{Gn} \\ Y_G V_{Gn} \end{bmatrix} \quad \text{(Eq. A6)}$$

Here [A] is a 6×6 matrix with the elements $A_{ij}$. Since equation A6 contains all matrix elements $A_{ij}$ of the amplifier we are now in a position to determine the Y-parameters $Y_{ij}^{(MA)}$ of the ensuing two-port. They are:

$$Y_{11}^{(MA)} = \quad \text{(Eq. A7a)}$$

$$\frac{A_{62}\Delta_H + (A_{63} + A_{64}Y_{C0})N_{22} - (A_{65} + A_{66}Y_G)N_{12}}{A_{52}\Delta_H + (A_{53} + A_{54}Y_{C0})N_{22} - (A_{55} + A_{56}Y_G)N_{12}}$$

$$Y_{12}^{(MA)} = \quad \text{(Eq. A7b)}$$

$$\left[ A_{61} + (A_{63} + A_{64}Y_{C0})\frac{N_{21}}{\Delta_H} - (A_{65} + A_{66}Y_G)\frac{N_{11}}{\Delta_H} \right] -$$

$$\left[ A_{62}\Delta_H + (A_{63} + A_{64}Y_{C0})\frac{N_{22}}{\Delta_H} - (A_{65} + A_{66}Y_G)\frac{N_{12}}{\Delta_H} \right] Y_{22}^{(MA)}$$

$$Y_{21} = \quad \text{(Eq. A7c)}$$

$$\frac{-1}{A_{52} + (A_{53} + A_{64}Y_{C0})N_{22}/\Delta_H - (A_{55} + A_{56}Y_G)N_{12}/\Delta_H}$$

$$Y_{22}^{(MA)} = \quad \text{(Eq. A7d)}$$

$$\frac{A_{51}\Delta_H + (A_{53} + A_{54}Y_{C0})N_{21} - (A_{55} + A_{65}Y_G)N_{11}}{A_{52}\Delta_H + (A_{53} + A_{54}Y_{C0})N_{22} - (A_{55} + A_{56}Y_G)N_{12}}$$

| | |
|---|---|
| $N_{11} = (A_{21} + A_{11}Y_D)H_{22} - (A_{41} + A_{31}Y_{CI})H_{12}$ | (Eq. A8a) |
| $N_{12} = (A_{22} + A_{12}Y_D)H_{22} - (A_{42} + A_{32}Y_{CI})H_{12}$ | (Eq. A8b) |
| $N_{21} = (A_{21} + A_{11}Y_D)H_{23} - (A_{41} + A_{31}Y_{CI})H_{13}$ | (Eq. A8c) |
| $N_{22} = (A_{22} + A_{12}Y_D)H_{23} - (A_{42} + A_{32}Y_{CI})H_{13}$ | (Eq. A8d) |
| $\Delta_H = H_{13}H_{22} - H_{12}H_{23}$ | (Eq. A9) |
| $H_{12} = (A_{23} + A_{24}Y_{C0}) + (A_{13} + A_{14}Y_{C0})Y_D$ | (Eq. A10a) |
| $H_{13} = (A_{25} + A_{26}Y_G) + (A_{15} + A_{16}Y_G)Y_D$ | (Eq. A10b) |
| $H_{22} = (A_{43} + A_{44}Y_{C0}) + (A_{33} + A_{34}Y_{C0})Y_{CI}$ | (Eq. A10c) |
| $H_{23} = (A_{45} + A_{46}Y_G) + (A_{35} + A_{36}Y_G)Y_{CI}$ | (Eq. A10c) |

It is clear from the formulas (A7–A10) that only a computer is able to quickly yield reliable results. At this point, as it has become quite common in the analytical treatment of distributed amplifiers, we will for a moment neglect the transistors' feedback ($Y_{12Fk}=0$). This step reduces the expressions (A7) to the comparatively simple equations:

$$Y_{11}^{(MA)} = \frac{A_{65} + A_{66} Y_G}{A_{55} + A_{56} Y_G} \quad \text{(Eq. A11a)}$$

$$Y_{12}^{(MA)} = 0 \quad \text{(Eq. A11b)}$$

$$Y_{21}^{(MA)} = \frac{1}{(A_{55} + A_{56} Y_G)(A_{22} + A_{12} Y_D)} \frac{\Delta_H}{H_{22}} \quad \text{(Eq. A11c)}$$

$$Y_{22}^{(MA)} = \frac{A_{21} + A_{11} Y_D}{A_{22} + A_{12} Y_D} \quad \text{(Eq. A11d)}$$

The use of equations A11a–d is, however, only permissible at frequencies where the active devices' internal feedback is negligible. Consequently, at high frequencies where the use of equations A11 may result in significant errors, the accurate formulas (A7), despite their complexity, need to be applied.

What is claimed is:

1. A microwave amplifier for amplifying a microwave frequency input signal, comprising:
   a plurality of sequentially coupled, multiplicatively amplifying tiers, each said tier having a plurality of transistors which additively amplify the signal entering said tier;
   an input transmission line for each said tier, including a plurality of nodes along said input transmission line;
   means for coupling the transistors in said tier to corresponding ones of said nodes along said input transmission line; and
   at least one line termination at one of the ends of said transmission line for absorbing signals incident on said end of said input transmission line;
   input means for transmitting said input signal to said input transmission line of a first one of said tiers;
   an output transmission line for transmitting the output of the last one of said sequentially coupled tiers to an output port, including a plurality of nodes along said output transmission line; and
   transforming elements for coupling the output of each said transistors to the corresponding node on a predefined one of said transmission lines, where said predefined transmission line is (a) said output transmission line for the transistors is said last tier, and (b) the input transmission line of the next sequentially coupled tier for the transistors not in said last tier;
   whereby said amplifier provides both multiplicative and additive amplification.

2. The amplifier of claim 1, wherein
said line termination in each of said input transmission lines includes resistor means for absorbing said incident signals;
said line termination in at least one of said input transmission lines includes a bias element coupling said transmission line to a corresponding bias voltage; and
said ouput transmission line includes
   an output network on one end of said output transmission line for transmitting the signal on said output transmission line to a specified output node;
   a line termination on the opposite end of said transmission line as said output network, for absorbing a.c. signals incident on said end of said transmission line; and a bias element coupling said transmission line to a corresponding bias voltage.

3. The amplifier of claim 2, wherein
the number of said tiers is m;
said successive tiers are indexed by values of k from 1 to m; and
each of said bias voltages is set in accordance with the formula:

$$V_k - V_{k-1} = C_k^*(V_{k-1} - V_{k-2})$$

where $V_k$ is the bias voltage for the transmission line of tier k, and each said $C_k$ is a value between 1.05 and 1.4.

4. The amplifier of claim 3, wherein
said input means is coupled to a predefined end of said input transmission line of said first tier; and
said output network is coupled to the same end of said output transmission line as said input means is coupled to said input transmission line of said first tier.

5. A microwave amplifier for amplifying a microwave frequency input signal, comprising:
a plurality of sequentially coupled, multiplicatively amplifying tiers, each tier having a plurality of transistors which additively amplify the signal entering said tier;
an input transmission line for each said tier, including
a plurality of serially connected transmission elements connected at corresponding nodes along said input transmission line;
means for coupling the transistors in said tier to corresponding ones of said nodes along said input transmission line; and
at least one line termination at one of the ends of said input transmission line for absorbing signals incident on said end of said transmission line;
input impedance matching means for transmitting said input signal to a predefined node on said input transmission line of a first one of said multiplicative tiers;
an output transmission line for transmitting the output of the last one of said multiplicative tiers to an output port, including a plurality of nodes along said output transmission line; and
transforming elements for coupling the output of each said transistor to the corresponding node on one of said transmission lines, where said transmission line is (a) said output transmission line for the transistors in the last multiplicative tier, and (b) the input transmission line of the next sequentially coupled, multiplicative tier for the transistors not in the last multiplicative tier;
whereby said amplifier provides both multiplicative and additive amplification.

6. The amplifier of claim 5, wherein
said line termination in each of said input transmission lines includes resistor means for absorbing said incident signals;
said line termination in at least one of said input transmission lines includes a bias element coupling said transmission line to a corresponding bias voltage; and
said output transmission line includes
an output network on one end of said output transmission line for transmitting the signal on said output transmission line to a specified output node;
a line termination on the opposite end of said transmission line as said output network, for absorbing a.c. signals incident on said end of said transmission line; and
a bias element coupling said transmission line to a corresponding bias voltage.

7. The amplifier of claim 6, wherein
the number of said tiers is m;
said successive tiers are indexed by values of k from 1 to m; and
each of said bias voltages is set in accordance with the formula $$V_k V_{k-1} = C_k^*(V_{k-1} - V_{k-2})$$

where $V_k$ is the bias voltage for the transmission line of tier k, and each said $C_k$ is a value between 1.05 and 1.4.

8. The amplifier of claim 6, wherein
said input means is coupled to a predefined end of said input transmission line of said first tier; and
said output network is coupled to the same end of said output transmission line as said input means is coupled to said input transmission line of said first tier.

* * * * *